(12) United States Patent
Neff et al.

(10) Patent No.: US 6,389,106 B1
(45) Date of Patent: May 14, 2002

(54) METHOD AND DEVICE FOR PRODUCING EXTREME ULTRAVIOLET AND SOFT X-RAYS FROM A GASEOUS DISCHARGE

(75) Inventors: Willi Neff; Rainer Lebert, both of Kelmis (BE); Guido Schriever, Aachen; Klaus Bergmann, Herzogenrath, both of (DE)

(73) Assignee: Fraunhoger-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/555,819
(22) PCT Filed: Dec. 2, 1998
(86) PCT No.: PCT/EP98/07829
  § 371 Date: Jul. 28, 2000
  § 102(e) Date: Jul. 28, 2000
(87) PCT Pub. No.: WO99/29145
  PCT Pub. Date: Jun. 10, 1999

(30) Foreign Application Priority Data

Dec. 3, 1997 (DE) .......................... 197 53 696

(51) Int. Cl.⁷ ................................ H01J 35/00
(52) U.S. Cl. ........................................ 378/122
(58) Field of Search .......................... 378/122

(56) References Cited

U.S. PATENT DOCUMENTS

| 4,771,447 A | | 9/1988 | Saitoh et al. |
| 5,499,282 A | | 3/1996 | Silfvast |
| 5,504,795 A | * | 4/1996 | McGeoch ................ 378/122 |

FOREIGN PATENT DOCUMENTS

| DE | 3942307 A1 | 7/1991 |
| EP | 0387838 A3 | 9/1990 |

* cited by examiner

*Primary Examiner*—Craig E. Church
(74) *Attorney, Agent, or Firm*—Crowell & Moring LLP

(57) ABSTRACT

A method and a device for generating extreme ultraviolet (EUV) and soft x-ray radiation from a gas discharge. The device has at least two electrodes each having a flush opening by which an axis of symmetry is defined, in which an intermediate space with a wide spatial homogenous gas filling between anode and cathode is provided. The electrodes are formed in such a way, that the gas discharge is formed exclusively in the volume defined by the flush openings. The current pulses with respect to amplitude and period duration are selected in such a way that a dense hot plasma channel is formed on the axis of symmetry, the plasma being the source of EUV and/or soft x-ray radiation. The preferred area of application is the EUV projection lithography in the spectral range around 13 nm.

20 Claims, 2 Drawing Sheets

METHOD AND DEVICE FOR PRODUCING EXTREME ULTRAVIOLET AND SOFT X-RAYS FROM A GASEOUS DISCHARGE

BACKGROUND AND SUMMARY OF THE INVENTION

This application claims the priority of 197 53 696.4, filed Dec. 3, 1997, the disclosures of which is expressly incorporated by reference herein.

The invention relates to a device and a method for the generation of extreme ultraviolet and x-ray radiation, in which the medium that emits the radiation is a plasma. A preferred field of use includes applications that require x-ray light around the 10 nm wavelength range, as is the case, for example, in EUV projection lithography around the 13 nm spectral range, where compact, cost-efficient and long-life x-ray light sources are required. An additional field of use includes x-ray analysis methods such as photo electron spectroscopy or fluoro-x-ray analysis, which utilize the spectral range of soft x-ray radiation, and which can be realized on a laboratory scale if a compact source is available. Furthermore, the method and device can be utilized for the characterization of x-ray optics or x-ray detectors.

The use of a plasma as a source for x-ray light is known. For this purpose, for example, plasma focus discharge, Z-pinch discharge, capillary discharge or the gas-puff are used.

In this way, a plasma is generated between two sheet electrodes during the z-pinch discharge, for which two operating methods are available for voltage pulse selection. On the one hand, it enables an operation in which the gas discharge ignites on the surface of the insulator. This results in considerable wear of the insulator. On the other hand, the current pulses can also be selected so that the gas discharge ignites in the entire available volume between the anode and cathode, which is limited by the insulator. Thus, at the start of the plasma ignition, one or more fine plasma channels can be found near the insulator and the electrodes, which are burned off as a result. Because of the intrinsic magnetic field of the current that flows at that time, the plasma channels are compressed into a single plasma channel (pinch effect) along the axis of symmetry of the electrode arrangement. Once the current is extinguished, the plasma spreads again up to the insulator, which also involves a burn-up of the insulator material. A further disadvantage of the Z-pinch discharge is the fact that intrinsic breakthrough operation is unsuitable for the formation of effective plasma emission. Typically, the Z-pinch is only used for a single pulse operation, and thus the yield of x-ray light is low. State of the art for the repetition rate, i.e., the rate for the build-up and breakdown of the x-ray light emitting plasma, is typically 20 pulses per second maximum.

If a gas puff is used to produce x-ray light emitting plasma, gas is admitted batch-wise through a suitably located opening in the insulator or the electrodes into the space between the anode and the cathode. The plasma build-up then occurs with the gas between the electrodes. Moreover, gas puff, Z-pinch and plasma focus discharge are carried out under high discharge currents (>100 kA) and in the range of several kilojoules for the electrically stored energy. They are thus optimized for a plasma, which emits x-ray light in this spectral range of several nanometers (hard x-ray radiation).

For longer wave radiation in the range of approximately 10 nm to approximately 50 nm, gas discharges with low currents or with a lower transferred energy per pulse are used.

At the same time, the capillary discharge is used, for example, which produces the same disadvantages with respect to wear mentioned above. As one of the variations of the embodiment a capillary discharge should be mentioned here, where use of the insulator for the ignition of the plasma is mandatory. Characteristic of this type of discharge is the vaporization of the insulator material that is subsequently converted to the plasma state. Thus, the insulator burn-off is also high. At the same time, all of the discharge types referred to are operated with an operating point on the right branch of the Paschen curve, with the plasma heated up by the pinch effect at the same time in order to attain the required temperature for the x-ray light emission.

The use of pseudo spark switches is known by way of prior art, which, for example, discloses one of the embodiment variations as a multi-channel pseudo spark switch in DE 39 42 307 A1. These are characterized in that the plasma is not ignited in contact with the insulator or the electrode surface, and that their overall life is therefore long. Their high repetition rate is also advantageous. The disadvantage of the switches however is that they are operated with respect to the type of gas, gas pressure and the current pulses in such a way that a plasma is formed in them which has only a low energy density, which rules out effective emission of EUV or x-ray radiation. Thus, for the emission of EUV or x-ray radiation a device would be advantageous in which the advantages of the Z-pinch discharge are combined with the advantages of the pseudo spark switch.

The object of the invention is to provide a device and a method for the generation of x-ray radiation and/or extreme ultraviolet (EUV) radiation from a gas discharge, with the insulator not exposed to any wear, and during which repetition rates up into the kHz range are possible, and at which suitable parameters for electrode geometry, gas pressure and type as well as current pulses for a plasma may be selected that can produce sufficiently high energy density or temperature so that an effective emission of soft x-ray radiation is achieved.

Other objects, advantages and novel features of the present invention will become apparent from the following detailed description of the invention when considered in conjunction with the accompanying drawings.

DETAILED DESCRIPTION OF THE PREFERRED EMBODIMENT

Figure 1:
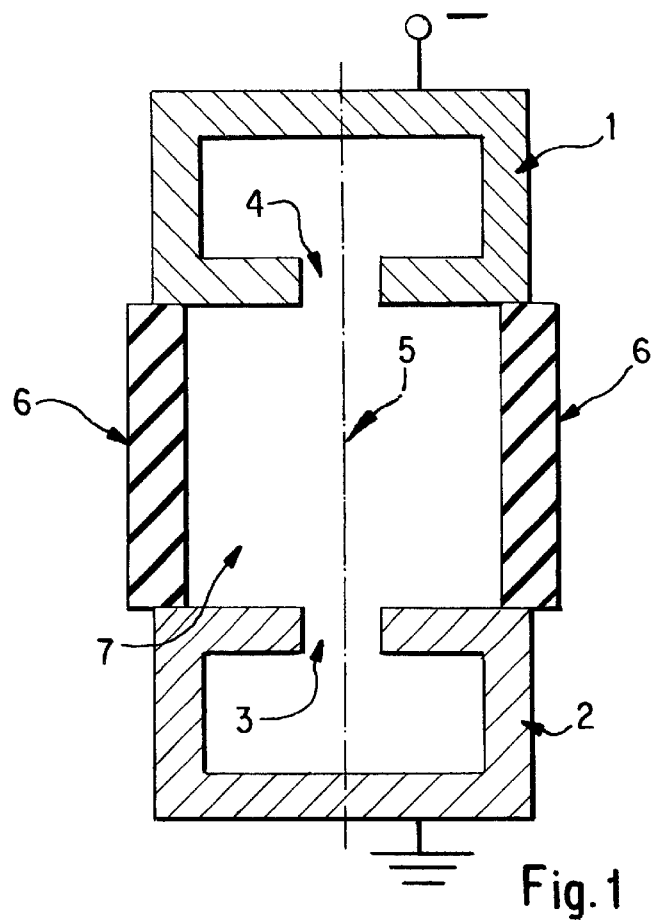
FIG. 1 is a single channel psuedo spark electrode configuration according to the present invention.

According to the invention it was learned that the above-mentioned disadvantages for x-ray sources generated by a gas discharge can be avoided by utilizing suitable electrode geometry to ensure that the plasma is far from the insulator. This can be done if a preferred direction is applied to the system, using suitable specified electrode geometry, such as for example a hollow cathode with a hollow anode. This preferred direction ensures by way of the Hittorf rerouting effect that the gas discharge forms exclusively along this preferred direction, away from the insulator. One electrode configuration that meets these requirements is for example the single channel pseudo spark switch, which is illustrated in FIG. 1. Here the electrodes must be configured in such a way that a gas-filled space (7) is located between them, and each electrode (1, 2) has an axially aligned opening (3, 4) by which an axis of symmetry (5) is defined, and in which the electrodes are cylindrically symmetrically aligned relative to the above-mentioned axis of symmetry (5). The axis of symmetry is then the preferred direction mentioned above. The openings of the electrodes have diameters in the millimeter range. An insulator (6) is located between the electrodes and separates the intermediate space between the anode and cathode from the outer area with higher gas pressure. In this case it is advantageous, if the insulator is designed as a stack of insulators and metal disks, since this improves the dielectric strength. Here, the electrode distance is in the millimeter to centimeter range. The gas pressure in the space between the electrodes is in the range from several pascals to a few tens of pascals. The operating point is so selected, that the product of the electrode distance and discharge pressure lies on the left branch of the Paschen curve. In this instance, the ignition voltage increases with falling gas pressure and fixed electrode geometry.

The ignition voltage generally depends upon the electrode geometry, the number of electrodes (at least two), the diameter of the openings in the at least two electrodes, and the selected operating pressure of the gas. After applying a voltage to the electrodes, which preferably should be within the kilovolt to a few tens of kilovolts range, an electrical field is built up in the electrode space, and then runs in good approximation parallel to the axis of symmetry. If the electrodes are developed as hollow electrodes, the electrical field lines also project into the hollow electrodes in the vicinity of the openings and generally also into the adjacent spaces next to the walls of the intermediate space.

If the voltages are sufficiently high, a gas discharge takes place as a result of the generally known mechanisms of multiplication of charge carriers during gas discharges. In this case, the ignition occurs either as a result of spontaneous breakdown through existing charge carriers, which for example, can be generated either by cosmic radiation, or, in a triggered operation, through the injection of charge carriers (plasma or electrons) into the space adjoining the cathode. Because of the described electrode geometry, the gas discharge cannot spread by taking the shortest way between the electrodes, since in this case the mean free path length of the charge carriers is greater than the electrode distance. The gas discharge thus seeks a longer path, since a sufficient number of ionizing pulses for maintaining the discharge are possible only with a satisfactory discharge path. This longer path can be specified by the openings in the present invention, by which the axis of symmetry is defined. The result is that only a single plasma channel is formed, which has the above-defined axis of symmetry (5), whose lateral expansion is defined by the openings. If the openings are concentric shaped boreholes, for example, then the plasma is formed within the cylinder volume defined by the boundaries of the boreholes. This is also predictable by computer simulations (J. B. Bouef, L. C. Pitchford, Pseudospark discharge by computer simulation, IEEE Trans. Plas. Sc. Vol. 19(2), 1991). With a gas discharge of the illustrated geometry on the left branch of the Paschen curve, the plasma channel buildup does not occur as during a streamer discharge through a single short-term electron avalanche, but in multiple stages through secondary ionization processes.

As a result, the plasma distribution is already highly cylindrically symmetric in the starting phase, without requiring an insulator wall, for instance. As a result, additional devices for igniting the plasma in the device according to the invention are not necessary, since a gas discharge can take place through spontaneous breakdown. However, by using an additional ignition device, the x-ray pulses can be precisely triggered, if so required by the application.

The presence of a plasma will generate the flow of the pulsed current, for which the current must be supplied by a suitable current source. By selecting a suitable amplitude and period length for the current pulses, the appropriate plasma temperature for the x-ray light emission can be adjusted, which typically lies in the five-digit Kelvin range. The gas or the gas mixture must be selected so that it emits characteristic radiation in the soft x-ray wavelength area in its plasma state, which is especially the case with gases with nuclear charge numbers $Z \geq 3$. The current pulses utilized should advantageously have amplitudes with a two-digit kiloamp number and periods within the two to three digit nanosecond ranges. Especially with these parameters for current pulses, the plasma is sufficiently compressed and heated in the space between the electrodes along the axis of symmetry, so that it reaches the required temperature for x-ray light emission.

The provision of the current pulses results from an integration of the electrode configuration in an electrical discharge circuit, which advantageously exhibits a capacitor bank that has capacitively stored energy. At the same time, the electrode system can either be connected directly to the capacitor bank, or a logic element can be located between the electrode system and that capacitor bank. The direct electrical connection is for example suitable for gas discharge operation by spontaneous breakdown, in which the gas discharge ignites itself upon reaching the ignition field strength. By utilizing a logic element between the electrode system in the capacitor bank, a voltage can be applied to the electrode system that is greater than the required ignition voltage.

Since the ignition voltage for a selected operating point rises with decreasing pressure on the left branch of the Paschen curve, this means that one can work at higher gas pressures. This leads to a higher intensity of the emitted radiation as desired, since the intensity scales up as a square of the gas pressure. In addition, repetition rates up into the kHz range can be attained, which is advantageous for many applications over the single-shot operation.

Where the required current pulses for the operation of an x-ray source are supplied by a capacitor bank, this forms a damped electrical oscillation circuit together with the electrode system, where the oscillating characteristics are determined by its parameters of capacity, inductance, and ohmic resistance. The above-mentioned values for the current amplitudes in such cases refer to the first half cycle of a current, whose strength oscillates and at the same time decreases.

Without limiting the general idea of the invention, the device according to the invention should be discussed as an embodiment.

Figure 2:
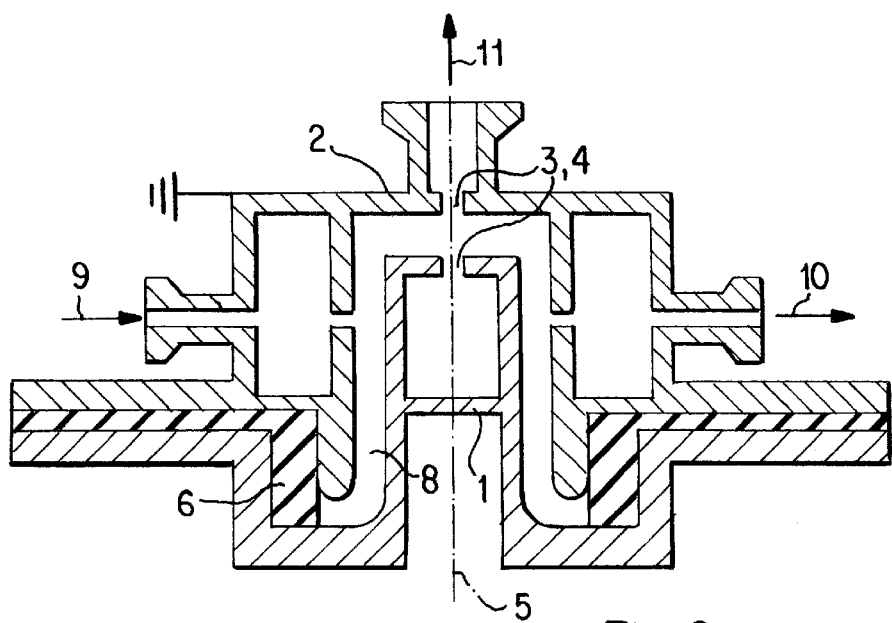
FIG. 2 is an electrode configuration for generating x-ray light from a gas discharge according to the invention.

FIG. 2 shows an electrode geometry in which the x-ray light can be generated from a gas discharge without insulator wear, as described. The distance of the round openings (3, 4) is 6 mm at a diameter of 5 mm. A steady flow of oxygen runs from the gas inlet (9) in the direction of the pump (10). It was determined that in this cylindrically symmetric arrangement, the pressure differentials in the vicinity of openings (3, 4) can be neglected in spite of the basic pressure gradient that is present, which is specified because of the openings of the anode and cathode. In the above case, the steady gas flow ensures a broadly three-dimensional homogenous gas pressure. However, it is also possible to work with a higher pressure gradient, so that a pressure differential exists between the gas inlet (9) and pump (10). The pressure measuring instrument integrates measured values over a time period of 5 seconds and supplies a value of 10 Pa.

At the same time, the operating point is so selected that the product of the electrode distance and the discharge pressure lies on the left branch of the Paschen curve. The complicated electrode system is directly connected to a plate capacitor, as shown in the drawing. The plasma channel in this embodiment is exclusively formed in the channel that is defined through and between openings (3, 4) along axis of symmetry (5). In the other spaces between anode (2) and cathode (1), for example in area (8), no plasma channel can form, since the long path required for ignition of the gas discharge is not present. The result is that the insulator (6) does not experience any burn-off. At a charge voltage of 6 kV between anode (2) and cathode (1), the current amplitude of the first half cycle was approximately 15 kA in the spontaneous breakdown operation which is practiced here, at an oscillation period of 730 ns. The emitted radiation is recorded by a detector (11).

Figure 3:
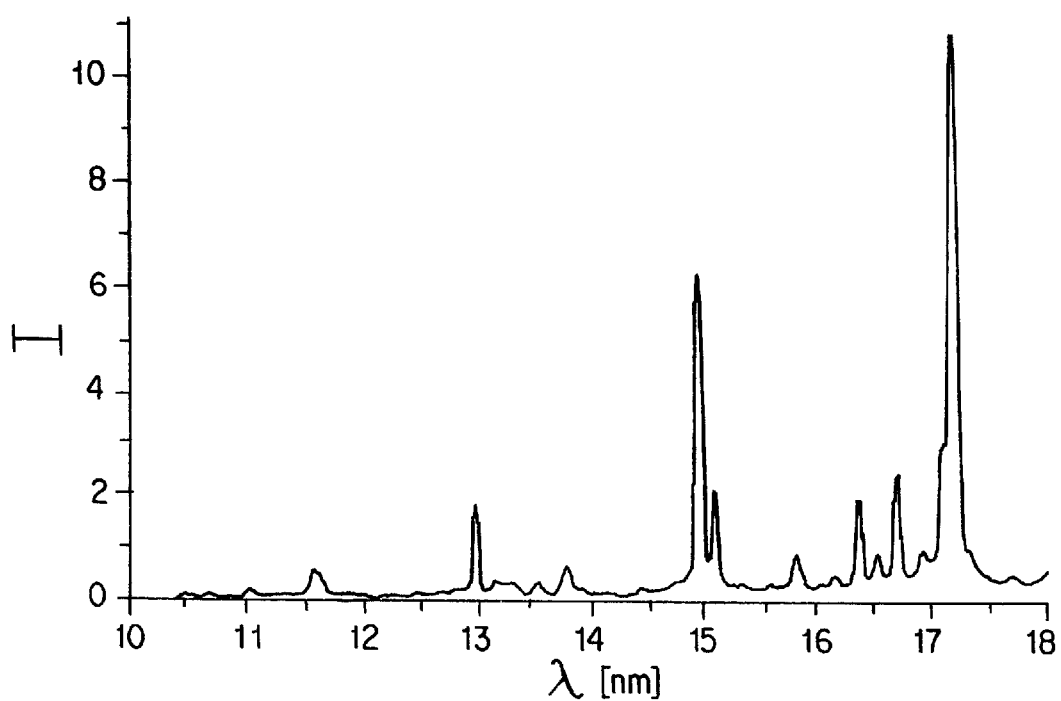
FIG. 3 is a grating spectrograph recording of an x-ray spectrum.

FIG. 3 shows a x-ray spectrum recorded with a grating spectrograph, utilizing a charge voltage of 6 kV. The detected intensity I is then shown in arbitrary units in nanometers with respect to wavelength 1. Characteristic transfers of oxygen ions occur, which contain only 3–4 electrons in the plasma state. This indicates a plasma temperature of approximately 20–40 Ev.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A device for generating extreme ultraviolet (EUV) and soft X-ray radiation from a gas discharge receiving a plurality of current pulses having an amplitude and a period so that a dense hot plasma channel is formed along a first axis wherein said plasma is a source for the EUV and/or soft X-ray radiation, said device comprising:

at least two electrodes wherein each of said at least two electrodes has one opening formed flush with a linear surface of said each electrode wherein said openings function to form an axis of symmetry between said openings wherein said axis of symmetry corresponds to the axis of said hot axis plasma channel; and an intermediate space with a substantially spatially homogenous gas positioned between two of said at least two electrodes.

2. Device according to claim 1 further including one or more gases with a nuclear chart number $Z \unicode{x00C6} 3$ located between the electrodes.

3. Device according to claim 1, wherein in that the electrodes are connected directly with a capacitor bank.

4. Device according to claim 3, further including a logic element located between the electrode system and the capacitor bank.

5. Device according to claim 1, further including a rapidly discharging capacitor bank for providing said current pulses.

6. Device according to claim 1, wherein the diameter of each opening is within the millimeter range.

7. Device according to claim 1, further comprising an insulator between the anode and cathode configured as a stack of insulators and metal disks.

8. Device according to claim 1, wherein the distance between the electrodes is in the millimeter to centimeter range.

9. Method for generating extreme ultraviolet (EUV) and soft x-ray radiation from a gas discharge, comprising the steps of providing a wide spatial homogenous gas filling in an intermediate space, which is located between at least two electrodes each of which has an opening formed flush with a linear surface of said each electrode;

selecting the gas pressure so that, after current pulses have been applied to the electrodes, the mean free path length of the charge carriers exclusively in the volumes determined by the flush openings is sufficient to form a plasma and, selecting the current pulses with respect to amplitude and period duration in such a way that a dense hot plasma channel is formed along the axis of symmetry which emits EUV and/or soft x-ray light.

10. Method according to claim 9, wherein the current pulses that flow in the presence of a plasma are provided by the rapid discharge of capacitively stored energy.

11. Method according to claim 10, wherein the rapid discharge is produced by the electrode system being connected directly to a capacitor bank.

12. Method according to claim 10, wherein the rapid discharge is achieved by closing a logic element between the electrodes and the capacitor bank.

13. Method according to claim 12, wherein a voltage is applied to the electrodes which is higher than the ignition voltage of the gas discharge.

14. Method according to claim 9, wherein the plasma is ignited by injection of plasma or charge carriers into the space adjacent to the cathode.

15. Method according to claim 9, wherein the current pulses are selected with a period within a two- to three-digit ns range.

16. Method according to claim 9, wherein the current pulses are selected with amplitudes in a two-digit kilo-amp range.

17. Method according to claim 9, wherein the plasma has a temperature in the six-digit Kelvin range.

18. Method according to claim 9, wherein the gas pressures are selected in the range of 1 Pa to several tens of Pa.

19. Method according to claim 9, wherein the plasma emits radiation with wavelengths shorter than 50 nm.

20. Method according to claim 9, wherein the gases selected for the intermediate space are those with a nuclear chart number $Z \geq 3$.

* * * * *